(12) United States Patent
Subramaniyan et al.

(10) Patent No.: US 9,531,335 B2
(45) Date of Patent: Dec. 27, 2016

(54) METHOD AND CIRCUITRY FOR CMOS TRANSCONDUCTOR LINEARIZATION

(71) Applicant: Texas Instruments Incorporated, Dallas, TX (US)

(72) Inventors: Harish Kundur Subramaniyan, Enschede (NL); Eric Klumperink, Lichtenvoorde (NL); Venkatesh Srinivasan, Dallas, TX (US); Ali Kiaei, San Jose, CA (US); Bram Nauta, Borne (NL)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/818,882

(22) Filed: Aug. 5, 2015

(65) Prior Publication Data
US 2016/0134240 A1 May 12, 2016

Related U.S. Application Data

(60) Provisional application No. 62/078,229, filed on Nov. 11, 2014.

(51) Int. Cl.
*G06G 7/12* (2006.01)
*H03F 3/193* (2006.01)
(Continued)

(52) U.S. Cl.
CPC ............ *H03F 3/193* (2013.01); *H03F 1/0261* (2013.01); *H03F 1/301* (2013.01); *H03F 1/308* (2013.01);
(Continued)

(58) Field of Classification Search
USPC ......... 327/52, 53, 58, 60, 62, 63, 65–69, 71, 72, 327/74, 77–81, 88, 89, 96, 127, 246, 266, 274,327/280, 287, 359, 560–563
See application file for complete search history.

(56) References Cited

U.S. PATENT DOCUMENTS

| 4,347,445 A * | 8/1982 | Baker .................. H03K 17/785 327/433 |
| 2010/0066450 A1* | 3/2010 | Palmer ................ H03F 3/45179 330/261 |

(Continued)

OTHER PUBLICATIONS

"Transconductor", cited as Ko-Chi Kuo, Transconductor, Advances in Solid State Circuit Technologies, Paul K. Chu (Ed.), ISBN 978-953-307-086-5, In Tech, Available from www.intechopen.com, 2010, pp. 25-45.

(Continued)

*Primary Examiner* — Brandon S Cole
(74) *Attorney, Agent, or Firm* — Michael A. Davis, Jr.; Charles A. Brill; Frank D. Cimino

(57) ABSTRACT

Third order distortion is reduced in a CMOS transconductor circuit that includes a first N-channel transistor and a first P-channel transistor, gates of the first N-channel transistor and the first P-channel transistor being coupled to receive an input signal. Drains of the first N-channel transistor and first P-channel transistor are coupled to an output conductor. A first degeneration resistor is coupled between a source of the first P-channel transistor and a first supply voltage and a second degeneration resistor is coupled between a source of the first N-channel transistor and a second supply voltage. A first low impedance bypass circuit is coupled between the sources of the first P-channel transistor and the first N-channel transistor. A low impedance bypass circuit re-circulates second order distortion current that is induced by second-order distortion in drain currents of the first P-channel transistor and the first N-channel transistor, through the first N-channel transistor and first P-channel transistor.

19 Claims, 5 Drawing Sheets

(51) Int. Cl.
*H03F 1/30* (2006.01)
*H03F 1/32* (2006.01)
*H03F 1/02* (2006.01)
*H03F 3/30* (2006.01)

(52) U.S. Cl.
CPC .......... *H03F 1/3205* (2013.01); *H03F 1/3217* (2013.01); *H03F 3/3022* (2013.01); *H03F 2200/294* (2013.01); *H03F 2200/451* (2013.01); *H03F 2203/30078* (2013.01); *H03F 2203/30111* (2013.01)

(56) References Cited

U.S. PATENT DOCUMENTS

| | | | | |
|---|---|---|---|---|
| 2012/0139636 A1* | 6/2012 | Scott | ............. | H03G 3/3042 330/285 |
| 2012/0292156 A1* | 11/2012 | Buerge | ............. | B65H 29/003 198/460.3 |
| 2013/0214832 A1* | 8/2013 | Palwai | ............. | H03L 7/0891 327/156 |
| 2014/0266444 A1* | 9/2014 | Scott | ............. | H03F 1/0227 330/257 |
| 2016/0134240 A1* | 5/2016 | Subramaniyan | ............. | H03F 1/301 327/560 |

OTHER PUBLICATIONS

"RF Transconductor Linearization Technique Robust to Process, Voltage and Temperature Variations", Harish Kundur Subramaniyan et al., IEEE Asian Solid-State Circuits Conference, Nov. 10-12, 2014, Kaohsiung, Taiwan Conference, pp. 1-4.

"RF Transconductor Linearization robust to Process, Voltage and Temperature Variations", Harish Kundur Subramaniyan et al., proposed paper submitted to IEEE Journal of Solid-State Circuits on Feb. 16, 2015, pp. 1-28.

* cited by examiner

METHOD AND CIRCUITRY FOR CMOS TRANSCONDUCTOR LINEARIZATION

CROSS REFERENCE TO RELATED APPLICATION

This application claims the benefit of co-pending U.S. provisional application Ser. No. 62/078,229 filed Nov. 11, 2014 entitled "Method and Circuitry for Improved CMOS Transconductor Linearization" by Harish Kundur Subramaniyan, Eric Klumperink, Venkatesh Srinivasan, Ali Kiaei, and Bram Nauta, and entirely incorporated herein by reference.

BACKGROUND OF THE INVENTION

The invention relates to a low-distortion "degenerated bypass CMOS (complementary metal oxide semiconductor) transconductor" that is more linear than a basic CMOS inverter/transconductor or a conventional "degenerated" CMOS transconductor. The invention also relates to achieving improved resilience or "robustness" of the degenerated bypass CMOS transconductor with respect to process, supply voltage and temperature (PVT) variation, compared to the resilience of either a basic CMOS transconductor or a conventional degenerated CMOS transconductor with respect to PVT variation.

Transconductance is a property of certain electronic components. Conductance is the reciprocal of resistance. Transconductance is the ratio of the AC current variation at the output of a component to the AC voltage variation at its input. A "transconductor" (which may be represented by the symbol Gm or gm) can be considered to be a circuit or circuit element having transconductance and which converts an input voltage signal into a proportional current. Many electronic devices, such as BJTs (bipolar junction transistors), MOSFETs (metal oxide semiconductor field effect transistors), and vacuum tube triodes can be useful as transconductors when properly biased. The transconductor is a versatile building block used in many analog and mixed-signal circuit applications such as continuous-time filters, delta-sigma modulators, variable gain amplifiers or data converters, and a wide range of other circuits such as filters, amplifiers, and oscillators.

FIG. 1A shows a conventional CMOS inverter 1l including a P-channel (PMOS) transistor MP1 and a N-channel (NMOS) transistor MN1 coupled between a supply voltage $V_{DD}$ and a physical ground conductor and having their gates connected to an input signal Vin and their drains connected to an output conductor 2 in which an output current $i_o$ is generated.

The output current of transconductor 1 (also referred to as CMOS inverter 1) shown in FIG. 1A can be approximated for low frequencies by a Taylor series expansion as:

$$i_o \approx (g_{mn} + g_{mp})V_{in} + (g'_{mn} + g'_{mp})V_{in}^2/2 + (g''_{mn} + g''_{mp})V_{in}^3/6 + \ldots \approx$$
$$g_m V_{in} + g'_m V_{in}^2/ + g''_m V_{in}^3/6 + \ldots$$

where $(g_{mn}, g_{mp}, g_m)$, $(g'_{mn}, g'_{mp}, g'_m)$, and $(g''_{mn}, g''_{mp}, g''_m)$ are the transconductance and its first and second derivatives of the NMOS, PMOS and CMOS devices, respectively, wherein the effects of voltage swing of the output current $i_o$ in conductor 2 and its higher order derivative terms are neglected. Yin represents the small-signal gate-to-source voltage of the NMOS transistor MN1 when two interfering signals at frequencies f1 and f2 are present at the input of the transconductor. Due to non-linear distortion, new frequency components at frequencies 2f1-f2 and 2f2-f1 are created at the output in addition to the fundamental input frequencies f1 and f2. If a weak signal to be sensed is present at frequencies 2f1-f2 or 2f2-f1, it is corrupted by these distortion components. If a transconductor is linear, the distortion components are very small. The two graphs included in FIG. 1A to illustrate distortion effects due to the two interference frequencies f1 and f2. For a CMOS transconductor circuit to be resilient or "robust" with respect to interference signals, it should be as linear as possible.

The conventional CMOS inverter 1 of FIG. 1A has various advantages and limitations with respect to its use as a transconductor. CMOS inverter 1 is an efficient transconductor because the same bias current flows through both the NMOS and PMOS transistors, resulting in addition of their transconductances $g_{mn}$ and $g_{mp}$. This leads to a higher gm/$I_D$ ratio or higher power efficiency, where gm is the transconductance and $I_D$ is the DC bias current through transistors MP1 and MN1. A purely differential circuit does not suffer from "even order distortion", so it is desirable to reduce the "odd order distortion" coefficients more than the even order ones because a MOS transistor is approximately a square-law device having low odd order distortion. Furthermore, a CMOS transconductor provides cancellation of non-linear current components in its N-channel and P-channel transistors using a linearization technique known as "complementary derivative superposition". The non-linear distortion properties of a CMOS transconductor may be demonstrated by the simulated output drain currents of the NMOS and PMOS transistors and their respective derivatives, as shown in the graphs of FIG. 1B.

In Equation 1, the second and third order distortion components are proportional to the first and second order derivatives gm' and gm'' of the transconductance gm respectively. These derivatives are shown in graphs C and D of FIG. 1B. Note that there is cancellation of both first and second order derivatives of the transconductances of the NMOS transistor and also the PMOS transistor leading to lower magnitudes of the corresponding derivatives of the CMOS inverter/transconductor. This leads to cancellation of distortion.

In particular, FIG. 1B shows a bias point Vin≈0.55 volts as indicated by dotted lines in graph D (the relevant graphs are graphs C, D, and E) for a properly designed CMOS transeonductor, where the second order derivative $g_m''$ is approximately zero for the N-channel transistor MN1 and the P-channel transistor MP1 in FIG. 1A. C-1, C-2 and C-3 are the first derivatives $g'_m$, $g'_{mn}$, and $g'_{mp}$, of the CMOS, NMOS and PMOS devices with respect to input voltage Vin, respectively. The vertical axis dimension in graph C is milli-Siemens per Volt (mS/V²). Similarly, the vertical axis dimension in graph D is Siemens per Volt Square (S/V²). The vertical axis dimension in graph E is VIIP3, which is normally given in Volts but can also be expressed as dBs which is the same as 20×Log10(VIIP3 in Volts).

A MOS transistor is approximately a square-law device, especially when it is biased at the peak of its first order derivative $g'_m$, shown in graph C of FIG. 1B. At this bias point, its second order derivative $g'''_m$ is zero. Unfortunately, at this bias point the first order derivatives $g'_m$ are at their maximum values. (The first order derivative $g'_m$ of the transeonductor is proportional to the second order distortion term $g'_m V^2$in/2 Similarly, the second order derivative $g''_m$ of the transeonductor is proportional to the third order distortion term $g''_m V^3 in/6$.) A small mismatch between the two transistor's third order distortion terms can lead to a large variation PIIP3. (The term "IIP3" is the "third order input intercept point" or "third order intercept point", which is the point at which the extrapolated output power in the third-order product and the fundamental tone intersect, assuming that the amplifier's distortion is predominantly third-order distortion. (In practice, when the input power levels are increased the higher order (5th, $7^{th}$, etc.) distortion terms start to dominate.) IIP3 is a very useful parameter to predict low-level intermodulation effects. Furthermore, the peak PIIP3 values shown in FIG. 1B are difficult to achieve for practical input voltage signal swings, as the input voltage does not stay at these peaks leading to lower worst case PIIP3 values. (The input voltage Vin sweeps across a range of values along the x-axes of FIG. 1B. Thus in practice the IIP3 peaks become less relevant.)

One application for a highly linear CMOS transconductor would be in a Software Defined Radio (SDR) system. SDR is a known technique that provides an economically viable solution to cope with the rapidly increasing number of wireless communication standards such as GSM, UMTS, LTE, etc. and the various associated frequency bands being allocated in various countries. Due to lack of linear and tunable RF filtering alternatives, a SDR receiver front end circuit must contend with strong interfering signals that can degrade its performance. To combine receiver operation in a broad band of frequencies with suitable impedance matching and low noise, receivers having noise cancellation have been used.

FIG. 2 shows a schematic diagram of a SDR receiver that utilizes frequency translated noise cancellation (FTNC). Since the main signal path can be very linear due to the use of a resistor and the distortion can be reduced by conventional noise/distortion cancellation techniques, the low noise transconductance amplifier (LNTA) in the auxiliary path becomes a "bottleneck" for out-of-band linearity of the SDR receiver, A LNTA is used in many recent CMOS receiver front end circuits. However, there is a substantial need for a technique to improve the linearity of the LNTA in a robust way that is insensitive to PVT variations.

A well-designed CMOS transconductor, while being quite linear due to use of non-linearity cancellation effects, could fail to meet certain very high linearity requirements. In many applications, a transconductor must meet guaranteed linearity specifications independently of process, component mismatch, and other variations. In the circuit of FIG. 3, a known linearization technique is used to achieve a better linearity specification than is achievable with a basic CMOS inverter/transconductor while nevertheless exploiting the above-mentioned non-linearity cancellation effect that is inherent in a CMOS inverter. The resulting "improved CMOS transconductor" is obtained using negative feedback, by using resistive degeneration as shown in FIG. 3.

In FIG. 3, a resistively degenerated N-channel transistor circuit 3 includes a N-channel MOS transistor MN1 and a degeneration resistor R coupled between the source of transistor MN1 and a fixed ground reference. An input voltage Vin is applied to the gate of transistor MN1 nd a drain current $I_{DS}$ flows through its drain and source and also through degeneration resistor R and provides a well-known resistive degeneration technique for improving linearity of CMOS transconductors.

Referring to FIG. 3, the gate of degenerated N-channel transistor MN1 is excited by two test tones of the input voltage Vin at closely spaced frequencies F1 and F2. The resulting second order distortion is shown in the graph of FIG. 3, and causes the drain current $I_{DS}$, and hence the source voltage $V_S$, to have second order distortion components at frequencies |F1-F2|, 2F1, and 2F2. The source voltage $V_S$ interacts with the gate voltage Vin through the second order distortion and causes the third order distortion components in the drain current $I_{DS}$ at frequencies 2F1-F2 and 2F2-F1. Essentially the same effect occurs in a degenerated PMOS transistor MP1 of a CMOS transconductor.

Due to the inherent square-law nature of a MOS transistor, the second order distortion component which dominates the non-linearity is converted to third order and other odd-order non-linearity components. This is particularly true in situations where the degeneration factor $g_m R$ is low. Negative feedback in these cases tries to suppress the total signal distortion, which is otherwise dominated by second-order distortion. The source voltage $V_S$ produced in response to $I_{DS}$ has second order distortion components at frequencies F2-F1, 2F1, 2F2 and F1+F2 as illustrated in FIG. 1l3. The square-law nature of MOSFETs MN1 mixes these second order $V_S$ tones on the source of transistor MN1 with Vin tones on the gate of transistor MN1, which also results in third order distortion components in the output current $i_o$ at frequencies 2F1-F2 and 2F2-F1. (A MOSFET has square-law behavior, wherein the gate-source voltage is squared. For example, if "a" is the gate voltage and "b" is the source voltage, then $(a-b)^2 = a^2 + b^2 - 2ab$. The term $ab$ is a mixing term which multiplies a by b. A similar effect happens in the degenerated P-channel transistor MP1 of a degenerated CMOS transconductor, and when the two output currents are combined or added the degenerated CMOS transconductor/inverter can have higher third order distortion than a basic CMOS inverter under the same biasing conditions.

Especially for low loop gain in a degenerated CMOS transconductor, the square-law term of a MOSFET can be problematic because it indirectly generates third-order distortion and higher order non-linearity and that third-order distortion is dependent on PVT variations. Thus, if source degeneration resistors are added to a basic CMOS inverter/transconductor, the quadratic drain currents $I_{DS}$ cause the source voltages $V_S$ to contain quadratic terms, and the MOSFETs MN1 and MP1 will mix these quadratic terms with the linear terms in the voltage signal Vin being applied to the gates of transistors MN1 and MP1 to generate a significant amount of third order distortion which otherwise would not exist without the resistive degeneration.

Similarly, the negative feedback in a resistively degenerated P-channel transistor circuit as in FIG. 3 tries to suppress the total distortion of resistively degenerated PMOS transconductor circuits which are otherwise dominated by second-order distortion. The graphs included in FIG. 3 illustrate the generation of such third order distortion.

Note that a more detailed analysis of resistive degeneration in MOS transistors and CMOS transconductors is set forth in the cited publication "RF Transconductor Linearization Technique Robust to Process, Voltage and Temperature Variations" by present inventors Harish Kundur Subramaniyan, Eric Klumperink, Venkatesh Srinivasan, Ali Kiaei, and Brain Nauta, presented at the IEEE Asian Solid-State Circuits Conference in Kaohsiung, Taiwan Nov. 10-12, 2014.

To summarize, a CMOS inverter is an efficient transconductor, because the same bias current flows through both the NMOS and PMOS transistors, resulting in addition of their transconductances $g_{mn}$ and $g_{mp}$ and consequently resulting in higher $g_m/I_D$ ratio or higher power efficiency. A purely differential circuit does not suffer from even order distortion, so it is desirable to reduce the odd-order distortion coefficients more than the even order distortion coefficients.

Thus, there is an unmet need for a CMOS-based transconductor circuit having better linearity than prior CMOS transconductor circuits utilizing cancellation of non-linear current components in the P-channel and N channel transistors of a CMOS inverter.

There also is an unmet need for a CMOS-based transconductor circuit which has better linearity than prior CMOS transconductor circuits utilizing cancellation of non-linear current components in the P-channel and N channel transistors of a CMOS inverter and which also is more robust with respect to PVT (Process, supply Voltage, and Temperature) variations.

There also is an unmet need for a CMOS-based transconductor circuit which achieves better linearity than prior CMOS transconductor circuits utilizing cancellation of non-linear current components in the P-channel and N channel transistors of a CMOS inverter by avoiding linearity degradation that occurs in prior CMOS transconductor circuits utilizing resistor degeneration.

There also is an unmet need for a CMOS-based transconductor circuit which achieves better linearity than prior art CMOS transconductor circuits without substantially degrading transconductor noise performance.

There also is an unmet need for a CMOS-based transconductor circuit which achieves better linearity than prior CMOS transconductor circuits utilizing cancellation of non-linear current components in the P-channel and N channel transistors of a CMOS inverter by avoiding linearity degradation that occurs in prior CMOS transconductor circuits utilizing resistor degeneration and which also does not introduce substantial additional noise compared to prior CMOS transconductor circuits utilizing resistor degeneration.

SUMMARY OF THE INVENTION

It is an object of the invention to provide a CMOS transconductor circuit and method having better linearity than prior CMOS transconductor circuits utilizing cancellation of non-linear current components in the P-channel and N channel transistors of a CMOS inverter.

It is another object of the invention to provide a CMOS transconductor circuit which has better linearity than prior CMOS transconductor circuits utilizing cancellation of non-linear current components in the P-channel and N channel transistors of a CMOS inverter and which also is more robust with respect to PVT (Process, supply Voltage, and Temperature) variations.

It is another object of the invention to provide a CMOS transconductor circuit which achieves better linearity than prior CMOS transconductor circuits utilizing cancellation of non-linear current components in the P-channel and N channel transistors of a CMOS inverter by avoiding linearity degradation that occurs in prior CMOS transconductor circuits utilizing resistor degeneration.

It is another object of the invention to provide a CMOS-based transconductor circuit which achieves better linearity than prior art CMOS transconductor circuits without substantially degrading transconductor noise performance.

It is another object of the invention to provide a CMOS transconductor circuit which achieves better linearity than prior CMOS transconductor circuits utilizing cancellation of non-linear current components in the P-channel and N channel transistors of a CMOS inverter by avoiding linearity degradation that occurs in prior CMOS transconductor circuits utilizing resistor degeneration without adding substantial additional transconductor noise to the output compared to prior CMOS transconductor circuits utilizing resistor degeneration.

Briefly described, and in accordance with one embodiment, the present invention reduces /third order distortion in a CMOS transconductor circuit (1-1) that includes a first N-channel transistor (MN1) and a first P-channel transistor (MP1), gates of the first N-channel transistor and the first P-channel transistor being coupled to receive an input signal (Vin). Drains of the first N-channel transistor and first P-channel transistor are coupled to an output conductor (2). A first degeneration element (18) is coupled between a source of the first P-channel transistor and a first supply voltage ($V_{DD}$) and a second degeneration element (20) is coupled between a source of the first N-channel transistor and a second supply voltage (GND). A first low impedance bypass circuit (24) is coupled between the sources of the first P-channel transistor and the first N-channel transistor, A low impedance bypass circuit (24) re-circulates second order distortion current, which is induced by second-order distortion in drain currents of the first P-channel transistor and the first N-channel transistor, through the first N-channel transistor and first P-channel transistor to reduce an amount of third order distortion current flowing to a load through the output conductor. The bypass circuit actually circulates the second order distortion of the PMOS and NMOS transistors, essentially canceling the second order distortion and thus prevents the conversion of second to third order distortion as described in FIG. 3.

In one embodiment, the invention provides a CMOS transconductor circuit (1-1,2,3) including a first CMOS inverter including a first N-channel transistor (MN1) and a first P-channel transistor (MP1), gates of the first N-channel transistor (MN1) and the first P-channel transistor (MP1) being coupled to receive a first input signal (Yin), drains of the first N-channel transistor (MN1) and first P-channel transistor (MP1) being coupled to a first output conductor (2); a first degeneration element (18A) coupled between a source of the first P-channel transistor (MP1) and a first supply voltage (VDD) and a second degeneration element (20A) coupled between a source of the first N-channel transistor (MN1) and a second supply voltage (GND); and a first low impedance bypass circuit (24,24A) coupled between the sources of the first P-channel transistor (MP1) and the first N-channel transistor (MN1) to provide a first low impedance bypass path to re-circulate second order distortion current induced by second-order distortion current in drain currents of the first P-channel transistor (MP1) and the first N-channel transistor (MN1) through the first P-channel transistor (MP1) and the first N-channel transistor (MN1) to reduce an amount of the third order distortion current flowing to a load through the first output conductor (2).

In one embodiment, the first degeneration element (18, 18A) includes a first degeneration resistor (18,18A) and the second degeneration element (20,20A) includes a second degeneration resistor (20,20A).

In one embodiment the first bypass circuit (24,24A) includes a regulator transistor (Mp) coupled between the drains (19,21) of the first P-channel transistor (MP1) and the first N-channel transistor (MN1), the regulator transistor (Mp) having a gate coupled to an error amplifier ((30) which operates to detect a difference between a source voltage or drain signal of the first P-channel transistor (MP1) and a source voltage or drain signal of the first N-channel transistor (MN1) so as to maintain a fixed voltage between the sources of the first P-channel transistor (MP1) and the first N-channel transistor (MN1). The first bypass circuit (24A) includes a bypass capacitor ($C_{BYPASS}$) coupled between the drains (19,21) of the first P-channel transistor (MP1) and the first N-channel transistor (MN1). The first bypass circuit (24A) also includes a first feedback resistor (28A) coupled between the drain (19) of the first P-channel transistor (MP1) and a first (−) input of the error amplifier ((30) and a second feedback resistor (28B) coupled between the drain (21) of the first N-channel transistor (MN1) and a second (+) input of the error amplifier ((30). The first bypass circuit (24A) includes a first feedback capacitor (27A) coupled between the source (19) of the first P-channel transistor (MP1) and a first (−) input of the error amplifier ((30) and a second feedback capacitor (27B) coupled between the source (21) of the first N-channel transistor (MN1) and a second (+) input of the error amplifier ((30).

In one embodiment, the first bypass circuit (24A) includes a third feedback resistor (29A) coupled between the first (−) input of the error amplifier ((30) and the first supply voltage ($V_{DD}$) and a fourth feedback resistor (29B) coupled between the second (+) input of the error amplifier (30) and the second supply voltage (GND).

In one embodiment, a P-channel bias transistor (MN) is coupled between the first supply voltage ($V_{DD}$) and a terminal of the first degeneration element (18) and a N-channel bias transistor (MN1) is coupled between the second supply voltage (GND) and a terminal of the second degeneration element (20), In one embodiment the CMOS transconductor circuit includes a second CMOS inverter including a second N-channel transistor (MN2) and a second P-channel transistor (MP2), gates of the second N-channel transistor (MN1) and second P-channel transistor (MP2) being coupled to receive a second input signal (Vinn), drains of the second N-channel transistor (MN2) and second P-channel transistor (MP1) being coupled to a second output conductor (36); a third degeneration element (18B) coupled between a source of the second P-channel transistor (MP2) and the first supply voltage ($V_{DD}$) and a fourth degeneration element (20B) coupled between a source of the second N-channel transistor (MN2) and the second supply voltage (GND); and a low impedance second bypass circuit (33) coupled between the drains of the second P-channel transistor (MP2) and the N-channel transistor (MN2) to provide a low impedance second bypass path to re-circulate second order distortion current induced by second-order distortion current in drain currents of the second P-channel transistor (MP2) and the N-channel transistor (MN2) through the second P-channel transistor (MP2) and the second N-channel transistor (MN2) to reduce an amount of the third order distortion current flowing to a load through the second output conductor (36). A P-channel coupling transistor $MP_{LN}$ is coupled between the sources of the first (MP1) and second (MP2) P-channel transistors and an N-channel coupling transistor $MN_{LN}$ coupled between the sources of the first (MP1) and second (MP2) N-channel transistors. A gate of the P-channel coupling transistor $MP_{LN}$ is coupled to receive a first control signal (LNbar) which is the logical complement of a second control signal (LN) that is coupled to a gate of the N-channel coupling transistor $MN_{LN}$. In one embodiment, a P-channel bias transistor (MPt) is coupled between the first supply voltage ($V_{DD}$) and the first degeneration element (18A) and a N-channel bias transistor (MN1) is coupled between the second supply voltage (GND) and the a terminal of the second degeneration element (20A).

In one embodiment, the invention provides a method for reducing third order distortion in a CMOS transconductor circuit (1-1,2,3) including a CMOS inverter including a first N-channel transistor (MN1 and a first P-channel transistor (MP1), gates of the first N-channel transistor (MN1 and the first P-channel transistor (MP1) being coupled to receive an input signal (Vin), drains of the first N-channel transistor (MN1 and first P-channel transistor (MP1) being coupled to an output conductor (2) and a first degeneration element (18) coupled between a source of the first P-channel transistor (MP1) and a first supply voltage ($V_{DD}$) and a second degeneration element (20) coupled between a source of the first N-channel transistor (MN1 and a second supply voltage (GND), the method including coupling a first low impedance bypass circuit (24) between the sources of the first P-channel transistor (MP1) and the first N-channel transistor (MN1; and operating a low impedance bypass circuit (24) to re-circulate second order distortion current induced by second-order distortion in drain currents of the first P-channel transistor (MP1) and the first N-channel transistor (MN1 through the first N-channel transistor (MN1 and first P-channel transistor (MP1) to reduce an amount of third order distortion current flowing to a load through the output conductor (2).

In one embodiment the method includes coupling a regulator transistor (Mp) between the sources (19,21) of the first P-channel transistor (MP1) and the first N-channel transistor (MN1) and operating the regulator transistor (Mp) in response to an error amplifier ((30) which operates to detect a difference between a source voltage signal of the first P-channel transistor (MP1) and a source voltage signal of the first N-channel transistor (MN1 so as to maintain a fixed voltage between the drains of the first P-channel transistor (MP1) and the first N-channel transistor (MN1.

In one embodiment the method includes providing a low impedance bypass path at low frequencies by coupling a bypass capacitor ($C_{BYPASS}$) between the sources (19,21) of the first P-channel transistor (MP1) and the first N-channel transistor (MN1. The second order distortion currents are canceled and prevent the second-to-third order distortion conversion and thereby reduces the third order distortion.

In one embodiment the method includes providing negative feedback by coupling a first feedback resistor (28A) between the source (19) of the first P-channel transistor (MP1) and a first (−) input of the error amplifier ((30) and also by coupling a second feedback resistor (28B) between the source (21) of the first N-channel transistor (MN1) and a second (+) input of the error amplifier ((30), and also by coupling a first feedback capacitor (27A) between the source (19) of the first P-channel transistor (MP1) and a first (−) input of the error amplifier ((30) and coupling a second feedback capacitor (27B) between the source (21) of the first N-channel transistor (MN1 and a second (+) input of the error amplifier ((30).

In one embodiment the method includes scaling the amount of negative feedback by coupling a third feedback resistor (29A) between the first (−) input of the error amplifier ((30) and the first supply voltage (VDD) and a by coupling fourth feedback resistor (29B) between the second (+) input of the error amplifier ((30) and the second supply voltage (GND).

In one embodiment the method includes biasing the CMOS transconductor circuit by coupling a P-channel bias transistor (MPt) between the first supply voltage ($V_{DD}$) and a terminal of the first degeneration element (18) and by coupling a N-channel bias transistor (MN1) coupled between the second supply voltage (GND) and a terminal of the second degeneration element (20).

In one embodiment, the invention provides a degenerated bypass CMOS transconductor circuit including a first CMOS inverter including a first N-channel transistor (MN1) and a first P-channel transistor (MP1), gates of the first N-channel transistor (MN1) and the first P-channel transistor (MP1) being coupled to receive an input signal (Vin), drains of the first N-channel transistor (MN1 and first P-channel transistor (MP1) being coupled to a first output conductor (2) and a first degeneration element (18A) coupled between a source of the first P-channel transistor (MP1) and a first supply voltage ($V_{DD}$) and a second degeneration element (20A) coupled between a source of the first N-channel transistor (MN1 and a second supply voltage (GND); bypass circuit means (24) for providing a low impedance path between the sources of the first P-channel transistor (MP1) and the first N-channel transistor (MN1); and means for operating the low impedance bypass circuit (24) to re-circulate second order distortion current induced by second-order distortion in drain currents of the first P-channel transistor (MP1) and the first N-channel transistor (MN1 to thereby reduce an amount of third order distortion current flowing to a load through the first output conductor (2).

DETAILED DESCRIPTION OF THE PREFERRED EMBODIMENTS

Figure 3:
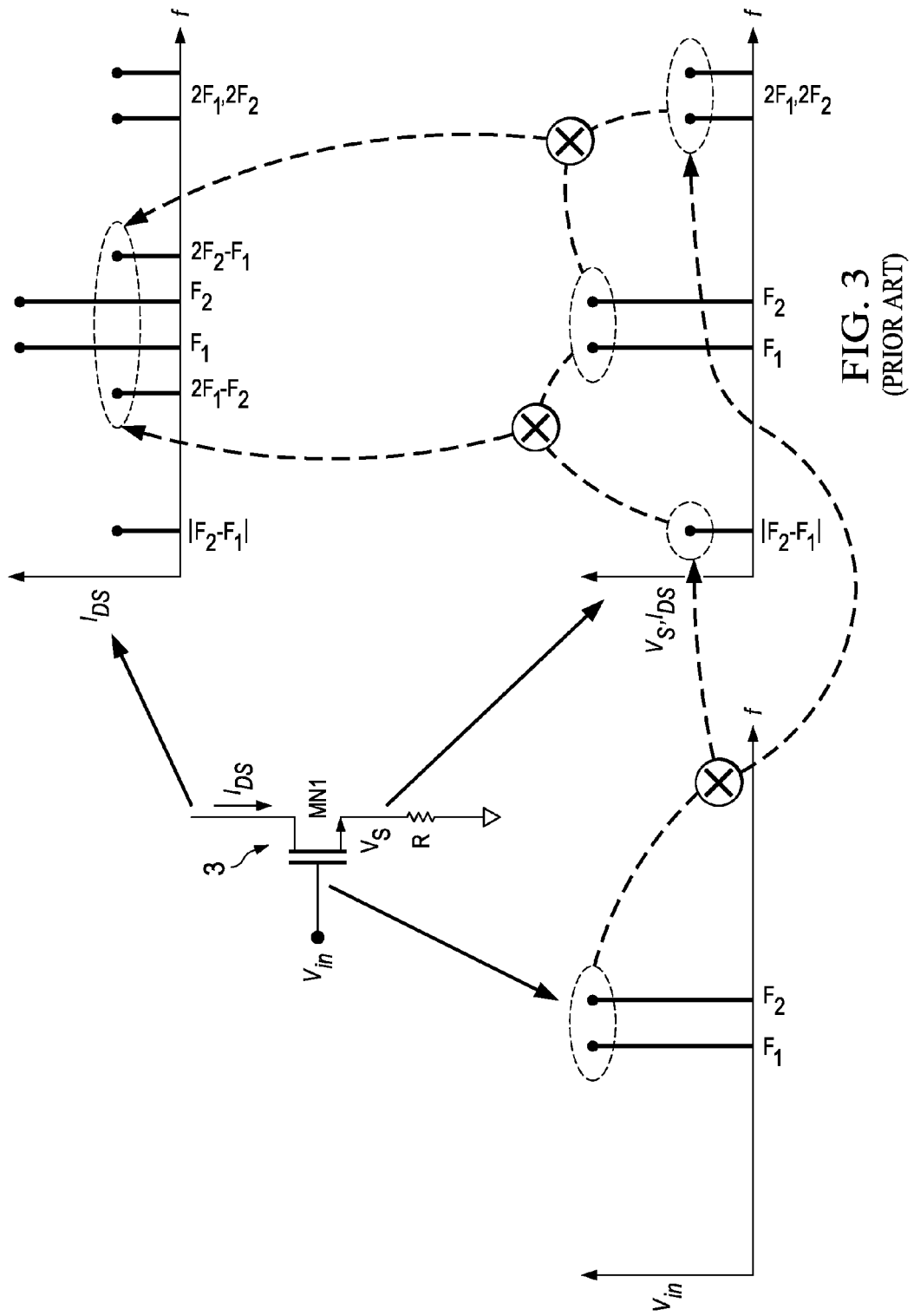
FIG. 3 is a diagram illustrating a resistively degenerated P-channel MOS transistor and its response to two test tones having closely spaced frequencies F1 and F2.

As previously described with reference to Prior Art FIG. 3, the "worse third order distortion" performance that occurs in prior "degenerated" CMOS transconductors is caused by loss of the advantage of distortion cancellation that ordinarily occurs in a CMOS inverter/transconductor.

Figure 4:
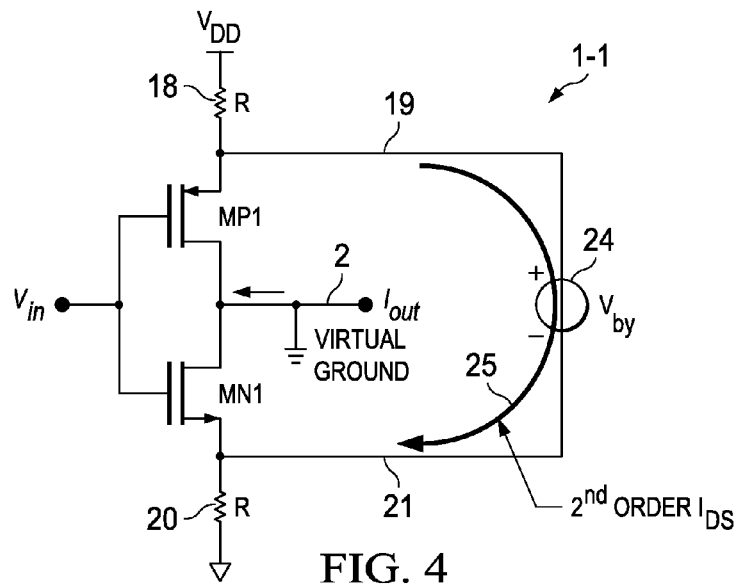
FIG. 4 is a simplified schematic diagram illustrating a CMOS transconductor in accordance with the present invention.

In accordance with the present invention, this advantage is "reclaimed" in a "degenerated bypass" CMOS transconductor by providing an electrically "floating" low impedance path for the second order distortion currents in a degenerated CMOS transconductor. FIG. 4 shows a simplified representation of an embodiment of an improved CMOS transconductor circuit that is more linear than prior degenerated CMOS transconductors while nevertheless achieving improved robustness to process, supply voltage, and temperature (PVT) variations.

Figure 2:
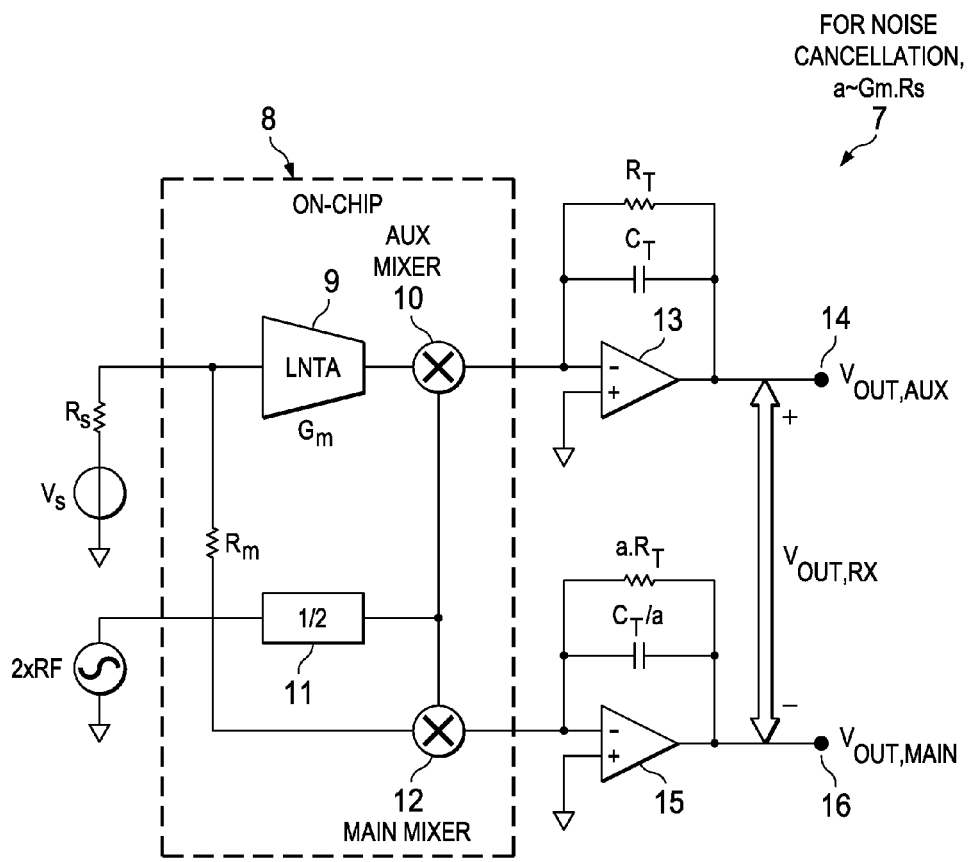
FIG. 2 is a schematic diagram of a conventional software-defined-radio receiver that utilizes frequency translated noise cancellation (FTNC).

In FIG. 4, a degenerated bypass CMOS transconductor 1-1 includes an N-channel MOS transistor MN1 having its gate coupled to receive an AC input voltage Yin, its drain coupled to an output conductor 2, and its source coupled by conductor 21 to one terminal of a degeneration resistor 20 of resistance R. The other terminal of degeneration resistor 20 is coupled to ground. A P-channel transistor MP1 has its gate coupled to receive Yin, its drain coupled to conductor 2, and its source coupled by conductor 19 to one terminal of a degeneration resistor 18 of resistance R. The other terminal of degeneration resistor 18 is coupled to $V_{DD}$. Output conductor 2 is at a virtual ground voltage. The drain currents of transistors MN1 and MP1 are converted to source voltages by the regeneration resistors, respectively. The virtual ground is an AC ground (the DC voltage is held approximately constant) and the current which flows through it is sensed as voltage at output of operational amplifiers, for example, as in Prior Art FIG. 2.

In FIG. 4, degenerated bypass CMOS transconductor 1-1 uses an electrically floating "bypass battery" circuit 24 producing a voltage Vby between its terminals and providing a very low impedance path in which the previously described second order distortion currents cancel each other. The second order distortion currents flowing through the degeneration resistors are what mainly causes the third order distortion currents mentioned above. In accordance with the present invention, an attempt was made to provide another low impedance current path for second order distortion currents so as to provide a bypass path through which second order distortion currents can re-circulate, as indicated by arrow 25 in FIG. 4 and therefore not flow through the output terminal 2 of the CMOS transconductor. The second order distortion currents of the N-channel transistor MN1 and the P-channel transistor MP1 are designed to be equal, and the electrically floating "bypass battery circuit" 24 provides the needed low impedance path. In practice, however, complementary MOS transistor mismatches ordinarily may introduce residual "quadratic" distortion currents terms, but they have been found to be substantially reduced by the present invention.

Degenerated bypass CMOS transconductor 1-1 is able both to utilize the second order distortion current cancellation process that is inherent in a CMOS inverter/transconductor and also substantially reduce the "residual" degeneration-resistor-induced third order distortion that remains after the previously mentioned second order distortion current cancellation by utilizing negative feedback provided by degeneration resistors 18 and 20. Bypass CMOS transconductor 1-1 thereby achieves substantially improved worst case linearity performance compared to prior degenerated CMOS transconductors. Degenerated bypass CMOS transconductor 1-1 is substantially more robust with respect to PVT variations than prior degenerated CMOS transconductors, because, unlike the prior degenerated CMOS transconductors, transconductor 1-1 of FIG. 4 does not rely primarily on the previously described second order distortion current cancellation mechanism to achieve a high level of linearity. Although implementing an "ideal" floating battery circuit is impractical, in accordance with the present invention a suitable low impedance path that accurately emulates a floating battery is achieved by using a floating voltage regulator circuit 24A as shown in FIG. 5.

Figure 5:
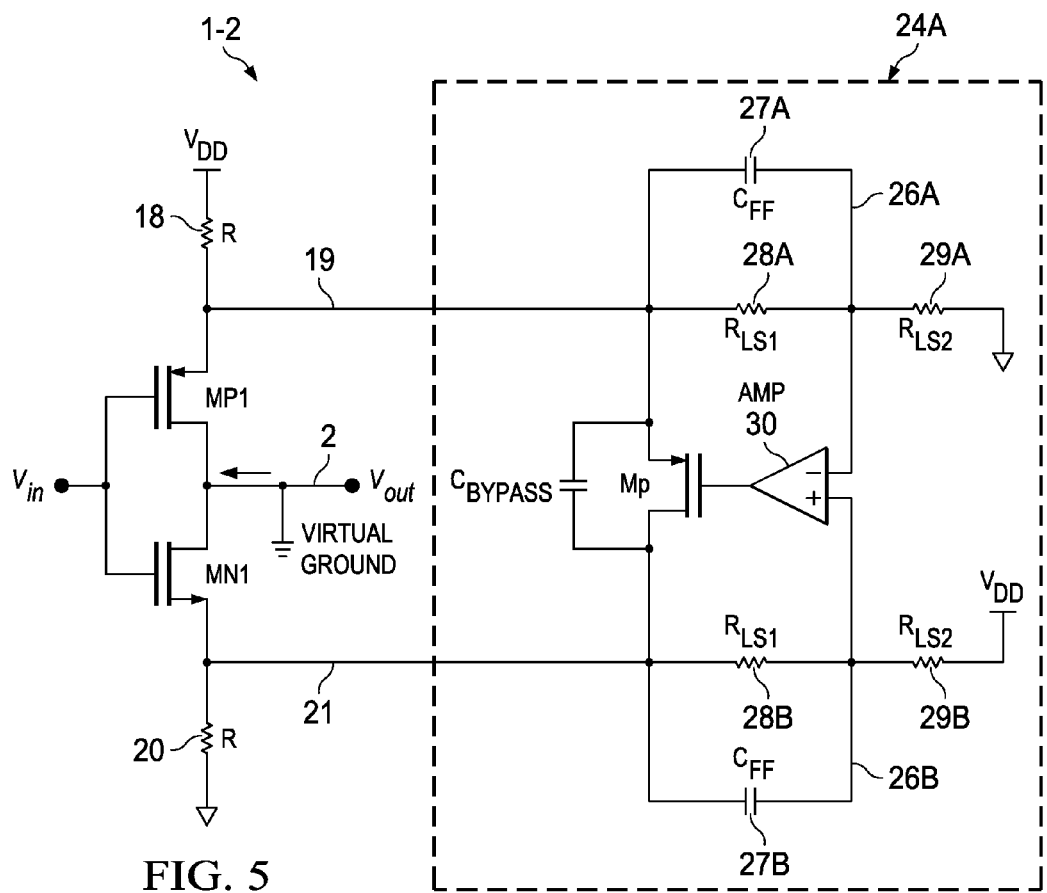
FIG. 5 is a more detailed schematic diagram illustrating an implementation of the CMOS transconductor of FIG. 4.

In FIG. 5, floating voltage regulator circuit 24A includes a P-channel MOS regulator transistor Mp having its gate connected to the output of an error amplifier 30. The source of regulator transistor Mp is connected to conductor 19, and its drain is connected to conductor 21. A bypass capacitor 31 of capacitance $C_{BYPASS}$ is connected in parallel with regulator transistor Mp between conductors 19 and 21. A feedback resistor 28A of resistance $R_{LS1}$ is connected between conductor 19 and a conductor 26A, and another feedback resistor 28B of resistance $R_{LS1}$ is connected between conductor 21 and a conductor 26B. A feedback capacitor 27A of capacitance $C_{FF}$ is connected in parallel with resistor 28A between conductor 19 and a conductor 26A, and another feedback capacitor 27B of capacitance $C_{FF}$ is connected in parallel with resistor 28B between conductor 21 and a conductor 26B. A feedback resistor 29A of resistance $R_{LS2}$ is connected between conductor 26A and ground, and another feedback resistor of resistance 29B $R_{LS2}$ is connected between conductor 26B and $V_{DD}$. (Note that transistors MN1 and MP1 and resistors 18 and 20 in FIG. 5 are connected the same way as in FIG. 4.) The transconductor output voltage Vout appears on conductor 2.

Parallel bypass capacitor $C_{BYPASS}$ enables floating voltage regulator circuit 24A to provide a suitable low-frequency bypass path between conductors 19 and 21 and also provides acceptable performance at high frequencies. In operation, the low frequency active path provided by bypass capacitor $C_{BYPASS}$ allows floating regulator 24A to cancel the low frequency second-order distortion components of the source voltages ($V_S$) at the frequency F1-F2; the high frequency capacitive path of bypass capacitor $C_{BYPASS}$ cancels the second order distortion components at the frequencies 2F1 and 2F2. The two feedback capacitors $C_{FF}$ help to stabilize the two negative feedback loops, respectively, and the feedback resistors $R_{LS1}$ and $R_{LS2}$ help to derive a scaled version of supply voltage $V_{DD}$, which is useful as the low impedance "floating battery" voltage source. In practice, the resistors may be variable to account for PVT (process, supply voltage, and temperature) variations.

The noise currents generated by bypass regulator 24A flow through regulator transistor Mp and circulate through N-channel transistor MN1 and P-channel transistor MP1, as indicated by the semicircular arrow 25 in FIG. 4. If the two transistors MN1 and MP1 are scaled to have the same transconductance, the noise currents generated by bypass regulator 24A do not reach the virtual AC ground voltage level.

The requirements for implementing the floating battery circuit 24 (FIG. 4) or 24A (FIG. 5) can be somewhat relaxed because its low impedance path is mainly important at the low frequencies F2−F1 and at approximately 2 times the RF frequencies 2F1, F1+F2, and 2F2. The path impedance of the floating battery circuit 24A need not necessarily be low at the RF frequency. For low frequencies, the floating voltage regulator or bypass amplifier provides the low impedance path, and at high frequencies the capacitive path $C_{BYPASS}$ provides a low impedance by-pass path at the "doubled" frequencies. Floating regulator 24A in FIG. 5 is implemented using P-channel regulator transistor Mp, which is driven by error amplifier 30. Error amplifier 30 may be an NMOS-input single stage cascode differential amplifier with a cascaded PMOS current mirror load circuit.

The capacitors $C_{FF}$ are used to stabilize the negative feedback loops. The resistors $R_{LS1}$ and $R_{LS2}$ are used to obtain a scaled version of supply voltage to be used as the floating battery output voltage. The four degeneration resistors $R_{LS1}$ and $R_{LS2}$ can be made variable with a feedback bias loop to automatically compensate PVT variations. In the degenerated bypass CMOS transconductor circuit 1-2 of FIG. 5, any noise/distortion currents generated by bypass regulator 24A that flow through regulator transistor Mp will circulate through the N-channel transistor MN1 and P-channel transistor MP1 provided that they have the same transconductance, so those noise/distortion currents will not reach the CMOS transconductor output. (Alternatively, in other embodiments of the invention P-channel transistor Mp may be replaced by an N-channel transistor.)

Figure 1A:
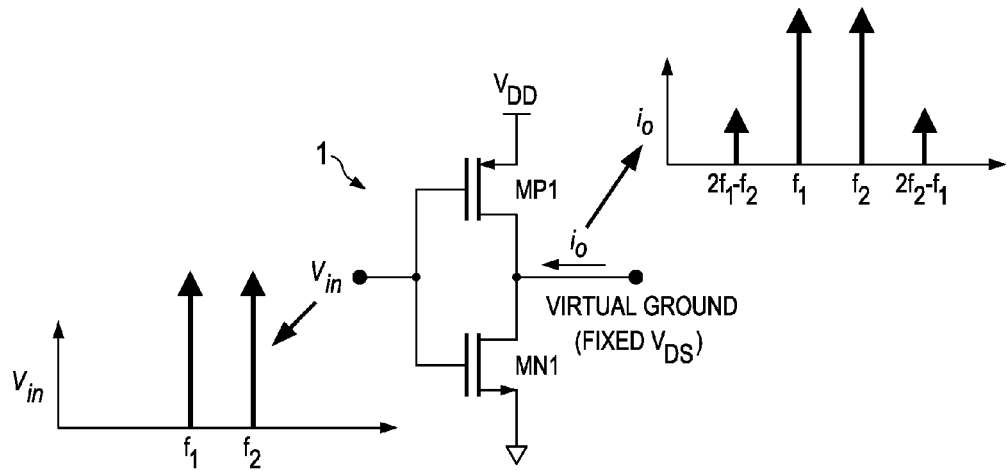
FIG. 1A is a schematic diagram of a conventional CMOS transconductor.
Figure 1B:
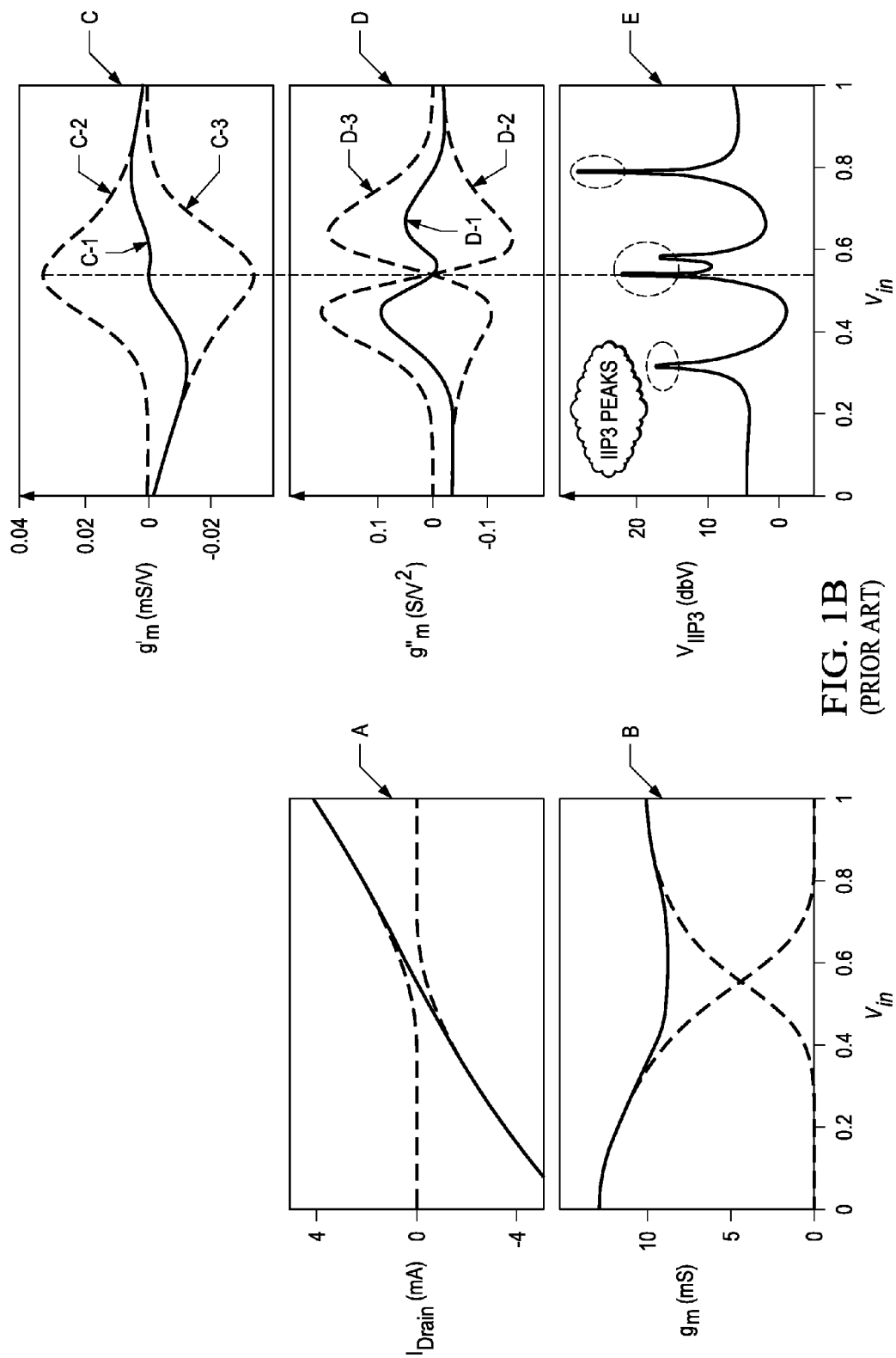
FIG. 1B illustrates graphs of the drain currents $I_{DSs}$, transconductance $g_m$, first derivative $g'_m$, and second derivative $g''_m$ of the transconductance, and the IIP3 peaks of the drain currents $I_{DS}$ of the CMOS transconductor of FIG. 1A.

Thus, the degenerated bypass CMOS transconductor circuits of FIGS. 4 and 5 are suitable for linear applications and low noise applications. Furthermore, in some advanced CMOS manufacturing processes, flicker noise corner frequencies are large, and a resistively degenerated MOS transistor generally has lower flicker noise corner frequency than a non-degenerated MOS transistor. Therefore, degeneration bypass CMOS transconductors 1-1 of FIGS. 4 and 1-2 of FIG. 5 are suitable for very linear, low noise applications, and have potential for wide-band applications. Note that all circuit components in degenerated bypass CMOS transconductor 1-2 of FIG. 5 can be made tunable in either a conventional digital manner or a conventional analog manner.

Figure 6:
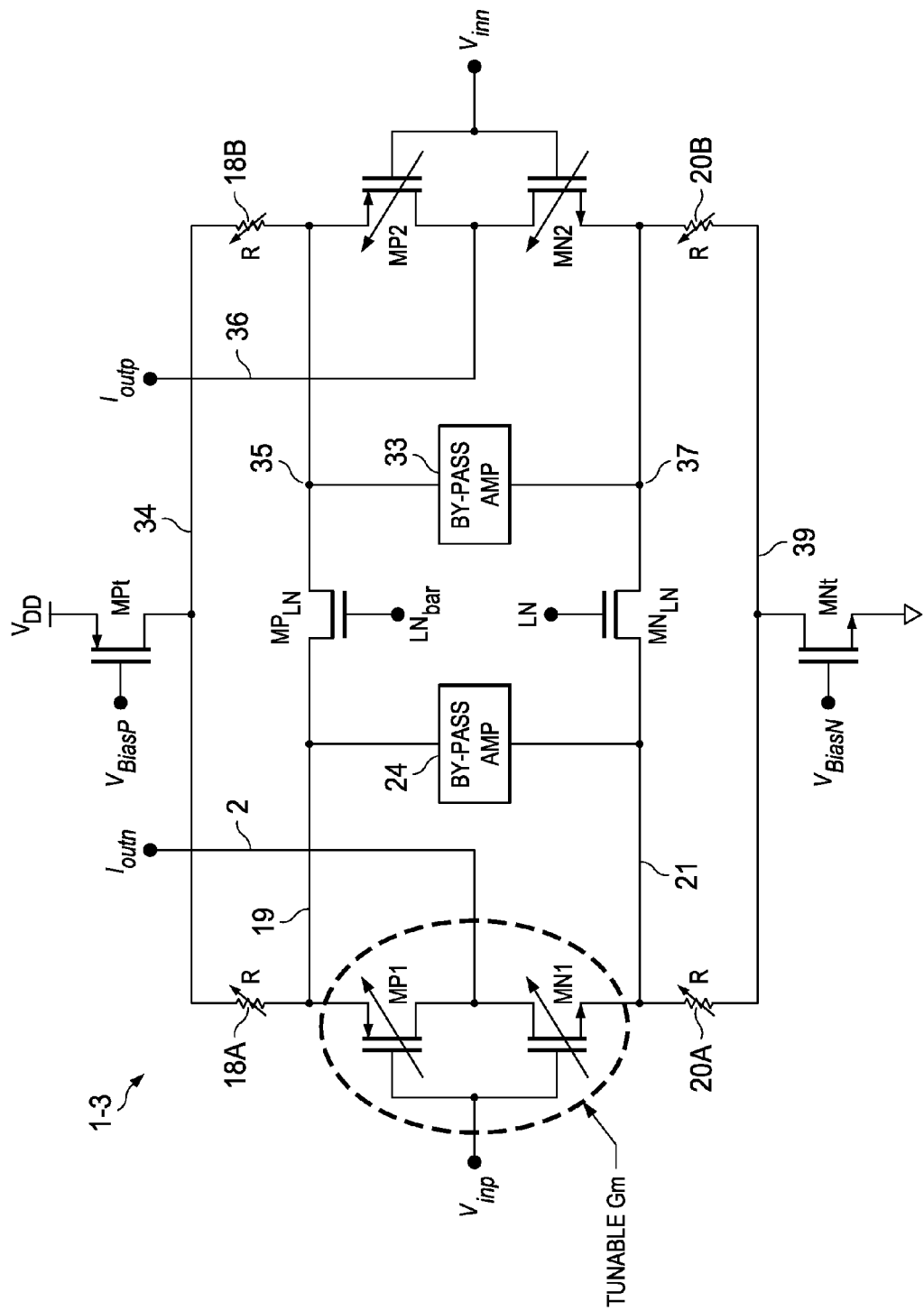
FIG. 6 is a detailed schematic diagram illustrating another implementation of the CMOS transconductor of FIG. 4.

FIG. 6, shows a differential implementation of the degenerated bypass CMOS transconductor 1-2 of FIG. 5 with the further capability of digitally tuning the transconductance components, as indicated by the sloped arrows through the CMOS inverter transistors and degeneration resistors. FIG. 6 shows a variation in which a pair of the regenerated bypass CMOS transconductors of FIG. 4 are linked together to provide a differential CMOS transconductor implementation. A first degenerated bypass CMOS transconductor includes transistors MP1 and MN1 having their gates coupled to receive input voltage signal Vinp, degeneration resistors 18A and 20A, and a bypass regulator 24 (which can be the same as bypass circuit 24A of FIG. 5. A second degenerated bypass CMOS transconductor includes transistors MP2 and MN2 having their gates coupled to receive another input voltage signal Vinn, degeneration resistors 18B and 20B, and a bypass regulator 33 which is the same as bypass voltage regulator 24A.

Degeneration resistors 18A and 18B are coupled to $V_{DD}$ by P-channel bias transistor MPt; similarly, degeneration resistors 20A and 20B are coupled to ground by N-channel bias transistor MPn. The gates of bias transistors MPt and MNt are coupled to receive suitable bias voltages $V_{BiasP}$ and $V_{BiasN}$, respectively. The sources of transistors MP1 and MP2 are coupled together by, P-channel coupling transistor $MP_{LN}$, and the source of transistors MN1 and MN2 are coupled together by N-channel coupling transistor $MN_{LN}$. Coupling transistors $MP_{LN}$ and $MN_{LN}$ are used as switches which put the transconductor in a "low noise" mode. They differentially disable degeneration resistors 18A and 20A and increase the gain of the transconductor, but also worsen the transconductor linearity. The gate of P-channel coupling transistor $MP_{LN}$ is coupled to receive a first control signal LNbar which is the logical complement of a second control signal LN that is coupled to the gate of N-channel coupling transistor $MN_{LN}$.

Transistors MPt and MN1 in FIG. 6 operate in their triode regions and are used to regulate the bias current of the transconductor; suitable bias voltages VBiasP and VBiasN are derived by using replica biasing. The circuit in FIG. 6 converts a input voltage to an output current, so it is a transconductor. (In the context of Prior Art FIG. 2, resistor Rm provides the input matching so the transconductor 9 behaves like an LNTA at its input when the effect of Rm effect is included.

Thus, FIGS. 5 and 6 show particular implementations of the improved degenerated bypass CMOS transconductor 1-1 of FIG. 4 using a floating bypass voltage regulator to allow second order distortion current cancellation. The degenerated bypass CMOS transconductor has been found to be more linear and more resilient or robust with respect to PVT variations than the prior CMOS transconductor because they still have the inherent distortion cancellation mechanisms that operate within any CMOS transconductor.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. However, various modifications to the described implementations are possible. For example, the regulator transistor Mp can be replaced by an NMOS or PMOS or another transconductor. The floating voltage regulator circuit can be implemented by other circuitry, e.g., by using multi-loop feedback. The output current of the NMOS and PMOS transistors can be combined using multiple signal paths, e.g., by using two mixers at RF to IF frequencies. Although the described embodiments of the invention utilize resistors as the degeneration devices, it is also possible to use resonant circuits, such as a LC parallel resonant tank circuit that behaves as a resistor, for a certain frequency range; such a resonant tank circuit would have an impedance having a "real" part that dominates for the frequency range of interest. In some cases the gates of transistors MP1 and MN1 may be coupled using capacitors or transformers.

It should be appreciated that the same basic degenerated bypass linearization concept can be implemented in various other types of CMOS technologies and their extensions, such as FinFET, FDSOI and multi-gate FETs. (FinFETs, FDSOI and multi-gate FETs are evolutions in CMOS transistor technology which enable the transistors to behave as better transconductors with higher output impedances.)

What is claimed is:

1. A CMOS (complementary metal oxide semiconductor) transconductor circuit comprising:
    (a) a first CMOS inverter including a first N-channel transistor and a first P-channel transistor, gates of the first N-channel transistor and the first P-channel transistor being coupled to receive a first input signal, drains of the first N-channel transistor and first P-channel transistor being coupled to a first output conductor;
    (b) a first degeneration element coupled between a source of the first P-channel transistor and a first supply voltage and a second degeneration element coupled between a source of the first N-channel transistor and a second supply voltage; and
    (c) a first low impedance bypass circuit coupled between the sources of the first P-channel transistor and the first N-channel transistor to provide a first low impedance bypass path to re-circulate second order distortion current induced by second-order distortion current in drain currents of the first P-channel transistor and the first N-channel transistor through the first P-channel transistor and the first N-channel transistor to reduce an amount of the third order distortion current flowing to a load through the first output conductor.

2. The CMOS transconductor circuit of claim 1 wherein the first bypass circuit includes a regulator transistor coupled between the drains of the first P-channel transistor and the first N-channel transistor, the regulator transistor having a gate coupled to an error amplifier which operates to detect a difference between a source voltage signal of the first P-channel transistor and a source voltage signal of the first N-channel transistor so as to maintain a fixed voltage between the sources of the first P-channel transistor and the first N-channel transistor.

3. The CMOS transconductor circuit of claim 2 wherein the first bypass circuit includes a bypass capacitor coupled between the drains of the first P-channel transistor and the first N-channel transistor.

4. The CMOS transconductor circuit of claim 3 wherein the first bypass circuit includes a first feedback resistor coupled between the drain of the first P-channel transistor and a first input of the error amplifier and a second feedback resistor coupled between the drain of the first N-channel transistor and a second input of the error amplifier.

5. The CMOS transconductor circuit of claim 4 wherein the first bypass circuit includes a first feedback capacitor coupled between the source of the first P-channel transistor and a first input of the error amplifier and a second feedback capacitor coupled between the source of the first N-channel transistor and a second input of the error amplifier.

6. The CMOS transconductor circuit of claim 5 wherein the first bypass circuit includes a third feedback resistor coupled between the first input of the error amplifier and the first supply voltage and a fourth feedback resistor coupled between the second input of the error amplifier and the second supply voltage.

7. The CMOS transconductor circuit of claim 2 wherein the regulator transistor is a P-channel transistor.

8. The CMOS transconductor circuit of claim 1 wherein the first degeneration element includes a first degeneration resistor and the second degeneration element includes a second degeneration resistor.

9. The CMOS transconductor circuit of claim 8 including a P-channel bias transistor coupled between the first supply voltage and a terminal of the first degeneration resistor and a N-channel bias transistor coupled between the second supply voltage and a terminal of the second degeneration resistor.

10. The CMOS transconductor circuit of claim 1 including:
    a second CMOS inverter including a second N-channel transistor and a second P-channel transistor, gates of the second N-channel transistor and second P-channel transistor being coupled to receive a second input signal, drains of the second N-channel transistor and second P-channel transistor being coupled to a second output conductor,
    a third degeneration element coupled between a source of the second P-channel transistor and the first supply voltage and the N-channel transistor and a fourth degeneration element coupled between a source of the second N-channel transistor and the second supply voltage, and
    a low impedance second bypass circuit coupled between the drains of the second P-channel transistor and the N-channel transistor to provide a low impedance second bypass path to re-circulate second order distortion current induced by second-order distortion current in drain currents of the second P-channel transistor and the N-channel transistor through the second P-channel transistor and the second N-channel transistor to reduce an amount of the third order distortion current flowing to a load through the second output conductor.

11. The CMOS transconductor circuit of claim 10 including a P-channel coupling transistor $MP_{LN}$ coupled between the sources of the first and second P-channel transistors and an N-channel coupling transistor $MN_{LN}$ coupled between the sources of the first and second N-channel transistors, a gate of the P-channel coupling transistor $MP_{LN}$ being coupled to receive a first control signal which is the logical complement of a second control signal that is coupled to a gate of the N-channel coupling transistor $MN_{LN}$.

12. The CMOS transconductor circuit of claim 10 including a P-channel bias transistor coupled between the first supply voltage and the first degeneration element and a N-channel bias transistor coupled between the second supply voltage and a terminal of the second degeneration element.

13. A method for reducing third order distortion in a CMOS transconductor circuit including a CMOS inverter including a first N-channel transistor and a first P-channel transistor, gates of the first N-channel transistor and the first P-channel transistor being coupled to receive an input signal, drains of the first N-channel transistor and first P-channel transistor being coupled to an output conductor and a first degeneration element coupled between a source of the first P-channel transistor and a first supply voltage and a second degeneration element coupled between a source of the first N-channel transistor and a second supply voltage, the method comprising:
 (a) coupling a first low impedance bypass circuit between the sources of the first P-channel transistor and the first N-channel transistor; and
 (b) operating a low impedance bypass circuit to re-circulate second order distortion current induced by second-order distortion in drain currents of the first P-channel transistor and the first N-channel transistor through the first N-channel transistor and first P-channel transistor to reduce an amount of third order distortion current flowing to a load through the output conductor.

14. The method of claim 13 including coupling a regulator transistor between the sources of the first P-channel transistor and the first N-channel transistor and operating the regulator transistor in response to an error amplifier which operates to detect a difference between a source voltage signal of the first P-channel transistor and a source voltage signal of the first N-channel transistor so as to maintain a fixed voltage between the sources of the first P-channel transistor and the first N-channel transistor.

15. The method of claim 14 including providing a low impedance bypass path at low frequencies by coupling a bypass capacitor between the sources of the first P-channel transistor and the first N-channel transistor.

16. The method of claim 14 including providing negative feedback by coupling a first feedback resistor between the source of the first P-channel transistor and a first input of the error amplifier and also by coupling a second feedback resistor between the source of the first N-channel transistor and a second input of the error amplifier, and also by coupling a first feedback capacitor between the source of the first P-channel transistor and a first input of the error amplifier and coupling a second feedback capacitor between the source of the first N-channel transistor and a second input of the error amplifier.

17. The method of claim 16 including scaling the amount of negative feedback by coupling a third feedback resistor between the first input of the error amplifier and the first supply voltage and a by coupling fourth feedback resistor between the second input of the error amplifier and the second supply voltage.

18. The method of claim 13 including biasing the CMOS transconductor circuit by coupling a P-channel bias transistor between the first supply voltage and a terminal of the first degeneration resistor and by coupling a N-channel bias transistor coupled between the second supply voltage and a terminal of the second degeneration resistor.

19. A degenerated bypass CMOS transconductor circuit comprising:
 (a) a first CMOS inverter including a first N-channel transistor and a first P-channel transistor, gates of the first N-channel transistor and the first P-channel transistor being coupled to receive an input signal, drains of the first N-channel transistor and first P-channel transistor being coupled to a first output conductor and a first degeneration element coupled between a source of the first P-channel transistor and a first supply voltage and a second degeneration element coupled between a source of the first N-channel transistor and a second supply voltage;
 (b) bypass circuit means for providing a low impedance path between the sources of the first P-channel transistor and the first N-channel transistor; and
 (c) means for operating the low impedance bypass circuit to re-circulate second order distortion current induced by second-order distortion in drain currents of the first P-channel transistor and the first N-channel transistor to thereby reduce an amount of third order distortion current flowing to a load through the first output conductor.

* * * * *